United States Patent
Chen

(10) Patent No.: US 11,437,811 B2
(45) Date of Patent: Sep. 6, 2022

(54) ELECTRONIC DEVICE

(71) Applicant: BEIJING XIAOMI MOBILE SOFTWARE CO., LTD., Beijing (CN)

(72) Inventor: Chaoxi Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 47 days.

(21) Appl. No.: 16/663,939

(22) Filed: Oct. 25, 2019

(65) Prior Publication Data
US 2020/0313427 A1    Oct. 1, 2020

(30) Foreign Application Priority Data

Mar. 29, 2019  (CN) .................... 201910253290.3

(51) Int. Cl.
*H02H 9/00* (2006.01)
*H02H 9/04* (2006.01)
(Continued)

(52) U.S. Cl.
CPC ............. *H02H 9/045* (2013.01); *H05K 1/025* (2013.01); *H05K 1/0259* (2013.01); *H04B 1/40* (2013.01);
(Continued)

(58) Field of Classification Search
CPC ...... H02H 9/045; H05K 1/025; H05K 1/0259; H05K 2201/0792; H05K 2201/09227; H04B 1/40
See application file for complete search history.

(56) References Cited

U.S. PATENT DOCUMENTS 8,818,309 B2 *  8/2014  Li ........................... H04B 1/18
                                                             455/340
10,389,012 B2 *  8/2019  Han ....................... H01Q 9/42
(Continued)

FOREIGN PATENT DOCUMENTS

CN          202111761 U       1/2012
CN          106058433 A       10/2016
(Continued)

OTHER PUBLICATIONS

Extended European Search Report dated May 15, 2020 in Patent Application No. 19206495.4, 9 pages.
(Continued)

*Primary Examiner* — Pete T Lee
(74) *Attorney, Agent, or Firm* — Oblon, McClelland, Maier & Neustadt, L.L.P.

(57) ABSTRACT

The disclosure relates to an electronic device including a circuit board; a housing; and an antenna, wherein the antenna and the circuit board are fixed inside the housing, wherein the circuit board comprises a first electrostatic protection circuit and a protected circuit, wherein the antenna is electrically connected to a first end of the first electrostatic protection circuit, and electrically connected to a first end of the protected circuit, wherein a second end of the first electrostatic protection circuit is electrically connected to a first ground point, a second end of the protected circuit is electrically connected to a second ground point, and the first electrostatic protection circuit is connected in parallel with the protected circuit, and wherein a trace distance between the second end of the first electrostatic protection circuit and the second end of the protected circuit is less than a first threshold, to reduce parasitic inductance.

19 Claims, 4 Drawing Sheets

(51) Int. Cl.
*H05K 1/02* (2006.01)
*H04B 1/40* (2015.01)

(52) U.S. Cl.
CPC ............... *H05K 2201/0792* (2013.01); *H05K 2201/09227* (2013.01)

(56) References Cited

U.S. PATENT DOCUMENTS

| | | | |
|---|---|---|---|
| 2008/9251591 | 11/2008 | Huang et al. | |
| 2011/0241967 A1* | 10/2011 | Kaikkonen | H01Q 7/00 343/851 |
| 2011/0267725 A1 | 11/2011 | Scuderi et al. | |
| 2014/0327048 A1* | 11/2014 | Chow | H01L 27/0292 257/195 |
| 2015/0045089 A1 | 2/2015 | He | |
| 2015/0333510 A1* | 11/2015 | Mullet | H01Q 1/50 361/33 |

FOREIGN PATENT DOCUMENTS

| | | |
|---|---|---|
| CN | 206116622 U | 4/2017 |
| CN | 108235832 A | 6/2018 |
| CN | 108770201 A | 11/2018 |
| CN | 109152188 A | 1/2019 |
| CN | 109219283 A | 1/2019 |
| CN | 109219330 A | 1/2019 |

OTHER PUBLICATIONS

Chinese Office Action and Search Report dated Sep. 3, 2021 in Chinese Patent Application No. 201910253290.3 (with English translation). 18 pages.

Notification to Grant Patent Right for Invention, dated Jun. 6, 2022, in counterpart Chinese application No. 201910253290.3 (w/English translation).

* cited by examiner

ELECTRONIC DEVICE

CROSS-REFERENCE TO RELATED APPLICATIONS

This application is based on and claims priority to Chinese Patent Application No. 201910253290.3, filed on Mar. 29, 2019, the entire contents of which are incorporated herein by reference.

TECHNICAL FIELD

The present disclosure relates to the field of electrostatic protection technologies, and in particular, to an electronic device.

BACKGROUND

Accumulation of electric charges on an object or a surface may form static electricity.

Static electricity is a potential hazard. For example, when static electricity flows inside the electronic device, it may damage electronic components.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide an electronic device. The electronic device includes a circuit board; a housing; and an antenna, wherein the antenna and the circuit board are fixed inside the housing, wherein the circuit board comprises a first electrostatic protection circuit and a protected circuit, wherein the antenna is electrically connected to a first end of the first electrostatic protection circuit, and electrically connected to a first end of the protected circuit, wherein a second end of the first electrostatic protection circuit is electrically connected to a first ground point, a second end of the protected circuit is electrically connected to a second ground point, and the first electrostatic protection circuit is connected in parallel with the protected circuit, and wherein a trace distance between the second end of the first electrostatic protection circuit and the second end of the protected circuit is less than a first threshold, so that a parasitic inductance between the second end of the first electrostatic protection circuit and the second end of the protected circuit approaches zero.

According to an aspect, a difference value between an actual turn-on voltage and a rated turn-on voltage of the first electrostatic protection circuit is positively correlated with the parasitic inductance.

According to another aspect, the first electrostatic protection circuit comprises a transient voltage suppressor (TVS).

According to yet another aspect, the circuit board further comprises a capacitive component, wherein the antenna and the first end of the first electrostatic protection circuit are electrically connected to a first end of the capacitive component, and a second end of the capacitive component is electrically connected to the first end of the protected circuit, and wherein the first electrostatic protection circuit is connected in series with the capacitive component.

According to yet another aspect, the circuit board further comprises an inductive component, wherein the antenna, the first end of the first electrostatic protection circuit, and the first end of the capacitive component are electrically connected to a second end of the inductive component, wherein a second end of the inductive component is electrically connected to a third ground point, and wherein the inductive component is connected in parallel with the first electrostatic protection circuit and the protected circuit.

According to yet another aspect, the inductive component and the capacitive component form a filter, wherein a frequency of a filtered signal corresponding to the filter is negatively correlated with an inductance value of the inductive component, and is negatively correlated with a capacitance value of the capacitive component.

According to yet another aspect, the electronic device further includes a metal middle frame; and at least one second electrostatic protection circuit provided between a main ground point of the circuit board and the metal middle frame.

According to yet another aspect, the main ground point of the circuit board, the second electrostatic protection circuit, and the metal middle frame form a path that satisfies a preset condition among respective discharge paths corresponding to the electrostatic energy.

According to yet another aspect, when the electrostatic energy is discharged to the main ground point of the circuit board, the second electrostatic protection circuit is turned on, and the electrostatic energy is returned to the metal middle frame through the second electrostatic protection circuit.

It is to be understood that both the foregoing general description and the following detailed description are illustrative and explanatory only and are not restrictive of the present disclosure.

BRIEF DESCRIPTION OF THE DRAWINGS

The accompanying drawings, which are incorporated in and constitute a part of this specification, illustrate aspects consistent with the present disclosure and, together with the description, serve to explain the principles of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of exemplary aspects do not represent all implementations consistent with the present disclosure. Instead, they are merely examples of devices and methods consistent with aspects related to the disclosure as recited in the appended claims.

In the electronic device provided by the aspects of the present disclosure, an electrostatic protection circuit is connected in parallel with a radio frequency circuit, and the trace distance between the electrostatic protection circuit and the radio frequency circuit is set to be short enough to reduce the parasitic inductance generated by the lead. So, when an alternating current signal in the static electricity discharged by the antenna passes through the parasitic inductance, the voltage difference between the second end of the electrostatic protection circuit and the second end of the radio frequency circuit is also small, and the actual turn-on voltage of the electrostatic protection circuit approaches the rated turn-on voltage. That is, when the antenna discharges the static electricity, the electrostatic protection circuit can be turned on in time to protect the radio frequency circuit from being damaged by the electrostatic energy.

Figure 1:
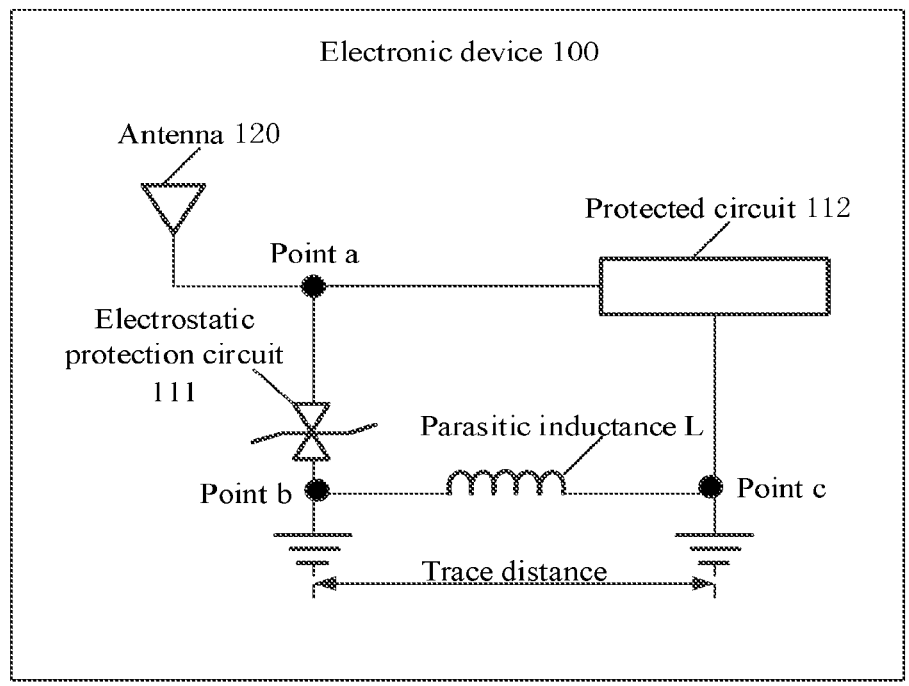
FIG. 1 is a schematic diagram of an electronic device according to an exemplary aspect of the present disclosure.

Please Refer to FIG. 1, which is a schematic diagram of an electronic device 100 in accordance with some aspects of the present disclosure, the electronic device 100 includes a circuit board (not shown in drawings), a housing (not shown in drawings), and an antenna 120.

The circuit board is a supporter for electronic components in the electronic device 100, and also a carrier for an electrical connection between the electronic components. The circuit board is manufactured by electronic printing technologies, and thereby also known as a printed circuit board (PCB). In an aspect of the present disclosure, the circuit board includes a first electrostatic protection circuit 111 and a protected circuit 112.

The first electrostatic protection circuit 111 is used to provide electrostatic protection to the protected circuit 112 in the circuit board, and thereby prevent electrostatic energy from damaging the electronic components in the protected circuit 112. The first electrostatic protection circuit 111 includes a transient voltage suppressor (TVS), which is a high-performance protection device typically connected in parallel in the circuit. When the circuit works properly, the TVS is in an off state (a high-impedance state). When an abnormal overvoltage occurs to the circuit and reaches a breakdown voltage of the TVS, the TVS turns to a low resistance state, so as to provide a low-impedance conduction path for the instantaneous current and simultaneously clamp the abnormal high voltage in a safe level to protect the protected line. When the abnormal overvoltage disappears, the TVS returns to the high-impedance state, and the circuit works properly again.

The protected circuit 112 is a functional circuit in the electronic device 100. In the aspects of the present disclosure, the protected circuit 112 refers to a radio frequency circuit for implementing a communication function of the electronic device 100.

The housing is used to fix the board and the antenna. The housing may be made of a glass material or a metal material, which is not limited in the aspects of the present disclosure.

The antenna 120 is used to achieve conversion between an electrical signal and an electromagnetic wave. When the electronic device 100 implements the receiving function, the antenna 120 converts the electromagnetic wave transmitted from a base station to the electrical signal. When the electronic device 100 implements the transmitting function, the antenna 120 converts the electrical signal to the electromagnetic wave.

The antenna 120 and the circuit board are fixed inside the housing.

The antenna 120 is electrically connected to a first end of the first electrostatic protection circuit 111, and also electrically connected to a first end of the protected circuit 112. The second end of the first electrostatic protection circuit 111 is electrically connected to the first ground point. The second end of the protected circuit 112 is electrically connected to the second ground point. The first electrostatic protection circuit 111 is connected in parallel with the protected circuit 112.

A trace distance between the second end of the first electrostatic protection circuit 111 and the second end of the protected circuit 112 is less than a first threshold, so that a parasitic inductance between the second end of the first electrostatic protection circuit and the second end of the protected circuit approaches zero. The above trace distance refers to a length of the lead between the first electrostatic protection circuit 111 and the protected circuit 112. The trace distance should be less than the distance between the antenna 120 and the protected circuit 112. The first threshold may be set according to experiments or experiences, which is not limited by the aspects of the present disclosure. The parasitic inductance is generated by the leads, and its impedance to the direct current is low but the impedance to the alternating current is high. The above trace distance is positively correlated with the inductance strength of the parasitic inductance. The greater the trace distance, the greater the inductance strength of the parasitic inductance; and the shorter the trace distance, the lower the inductance strength of the parasitic inductance.

Optionally, a difference value between an actual turn-on voltage and a rated turn-on voltage of the first electrostatic protection circuit 111 is positively correlated with the parasitic inductance. That is, the greater the parasitic inductance, the greater the difference value between the actual turn-on voltage and the rated turn-on voltage of the first electrostatic protection circuit 111; and the smaller the parasitic inductance, the smaller the difference value between the actual turn-on voltage and the rated turn-on voltage of the first electrostatic protection circuit 111. In the aspects of the present disclosure, the trace distance between the second end of the first electrostatic protection circuit 111 and the second end of the protected circuit 112 is set to be less than a certain threshold, so that the parasitic inductance approaches zero, and the actual turn-on voltage of the first electrostatic protection circuit 111 approaches the rated turn-on voltage, which enables the first electrostatic protection circuit 111 to be turned on in time to protect the protected circuit 112 from being damaged by the static electricity.

In conjunction with and referring to FIG. 1, the first end of the first electrostatic protection circuit is point a; the second end of the first electrostatic protection circuit is point b; the second end of the protected circuit is point c; and the lead between the first electrostatic protection circuit 111 and the protected circuit 112 is equivalently a parasitic inductance L, which is 0 for the direct current signal and Z for the alternating current signal. When the antenna 120 discharges the static electricity, the instantaneous voltage at the point a is high. Supposing that the voltage at the point a (namely, the actual turn-on voltage) is $v_a$, the voltage at the point b is $v_b$, and the turn-on voltage of the first electrostatic protection circuit 111 (that is, the rated turn-on voltage) is $v_{on}$, $v_b=0$ since the point b is connected to the ground point of the protected circuit 112 and needs to discharge the static electricity. When it satisfies that $V_a=V_{on}+V_b=V$on, the first electrostatic protection circuit 111 is turned on, and the static electricity discharged by the antenna 120 is discharged. The current discharged may either be direct current or alternating current. The direct current is rapidly discharged through the turned-on first electrostatic protection circuit 111. For the alternating current energy, its impedance Z is JWL since the parasitic inductance L accesses the direct current but resists the alternating current. Thus, the voltage generated by the alternating current in the static electricity on the parasitic inductance is the voltage at the point b, which is $v_b=ZI=JWLI>0$. At this time, $V_a$ rises, and when the instantaneous voltage of the static electricity is greater than $V_{on}$ and less than $V_a$, the first electrostatic protection circuit 111 will not be turned on and thereby cannot protect the protected circuit 112. At this time, the static electricity may damage the protected circuit 112.

In summary, in the electronic device provided by the aspects of the present disclosure, an electrostatic protection circuit is connected in parallel with a radio frequency circuit, and the trace distance between the electrostatic protection circuit and the radio frequency circuit is set to be short enough to reduce the parasitic inductance generated by the lead. So, when an alternating current signal in the static electricity discharged by the antenna passes through the parasitic inductance, the voltage difference between the second end of the electrostatic protection circuit and the second end of the radio frequency circuit is also small, and the actual turn-on voltage of the electrostatic protection circuit approaches the rated turn-on voltage. That is, when the antenna discharges the static electricity, the electrostatic protection circuit can be turned on in time to protect the radio frequency circuit from being damaged by the electrostatic energy.

Figure 2:
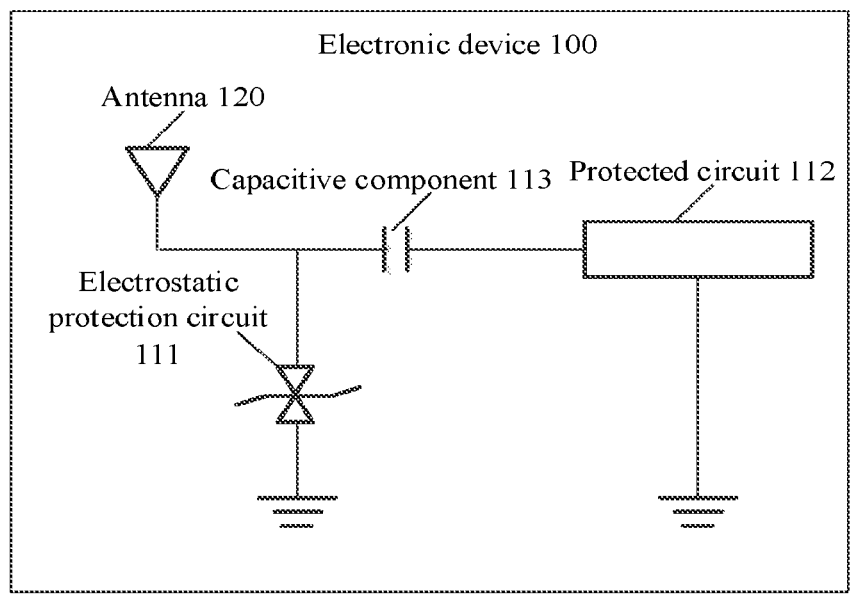
FIG. 2 is a schematic diagram of an electronic device according to another exemplary aspect of the present disclosure.

In an optional aspect based on the exemplary aspect of the present disclosure shown in FIG. 1, please refer to FIG. 2, the circuit board further includes a capacitive component 113. The capacitance value of the capacitive component 113 can be set according to actual needs, which is not limited by the aspects of the present disclosure. The antenna 120 and the first end of the first electrostatic protection circuit 111 are electrically connected to the first end of the capacitance element 113, and the second end of the capacitance element 113 is electrically connected to the first end of the protected circuit 112. The first electrostatic protection circuit 111 is connected in series with the capacitance element 113.

When the electrostatic energy enters the circuit board, it may cause thermal failure due to the momentary but large current. The power may be calculated by the following formula (1):

$$P = I^2 R = \left(\frac{U}{R}\right)^2 R = \frac{U^2}{R^2} R = \frac{U^2}{R}; \quad (1)$$

According to the above formula (1), it can be obtained that the voltage caused by static discharge is random. By increasing a signal link impedance R, the energy may be decreased and the current may be reduced, thereby decreasing the thermal failure.

The first electrostatic protection circuit 111 can discharge a part of the electrostatic energy to the first ground point in time, but some electrostatic energy may be still transmitted to the protected circuit 112 in the next stage. When the electrostatic energy transmitted to the protected circuit 112 is greater than the maximum value that the protected circuit 112 can withstand, the protected circuit 112 burns out and causes damages to the function of the electronic device 100. In the aspects of the present disclosure, a capacitive component 113 is additionally provided between the antenna 120 and the protected circuit 112. Due to the characteristic of accessing the alternating current but resisting the direct current, the capacitive component 113 may isolate the direct current signal in the electrostatic energy to reduce the amount of electrostatic energy transmitted to the protected circuit 112 in the next stage, thereby protecting the protected circuit 112 from being damaged by the excessive electrostatic energy.

Figure 3:
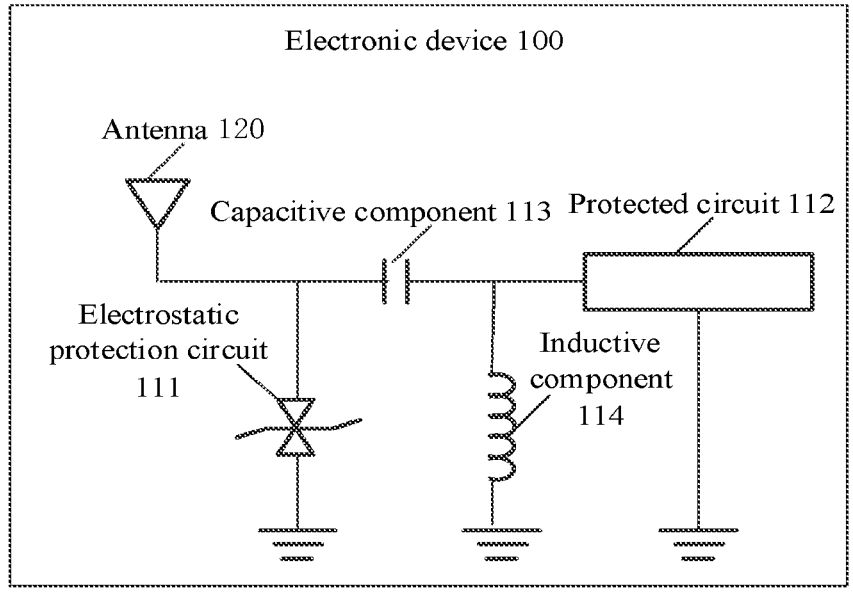
FIG. 3 is a schematic diagram of an electronic device according to another exemplary aspect of the present disclosure.

In an optional aspect based on the exemplary aspect of the present disclosure shown in FIG. 2, please refer to FIG. 3, where the circuit board further includes an inductive component (inductor) 114. The inductance value of the inductive component (inductor) 114 may be set according to actual needs, which is not limited by the aspects of the present disclosure. The antenna 120, the first end of the first electrostatic protection circuit 111, and the first end of the capacitance element 113 are electrically connected to the second end of the inductance element 114, and the second end of the inductance element 114 is electrically connected to the third ground point. The inductance element 114 is connected in parallel with the first electrostatic protection circuit 111 and the protected circuit 112.

As mentioned in FIG. 2 that is in accordance with an aspect of the present disclosure, the capacitive component 113 may isolate the direct current in the electrostatic energy, but the alternating current may be still transmitted to the protected circuit 112 through the capacitance element 113. The impedance of the capacitive component 113 may be calculated by the following formula (2):

$$Z = \frac{1}{JWC}; \quad (2)$$

By substituting the formula (2) into the formula (1), the following formula (3) is obtained:

$$P = I^2 R = \left(\frac{U}{R}\right)^2 R = \frac{U^2}{R^2} R = \frac{U^2}{R} = \frac{U^2}{\frac{1}{JWC}} = U^2 JWC; \quad (3)$$

According to the above formula (3), it can be obtained that when the capacitance value of the capacitive component 113 is large, the energy flowing into the protected circuit 112 is still large, and the protection to the protected circuit 112 is limited. When the capacitance value of the capacitive component is small, the energy flowing into the protected circuit 112 is also small, and the protected circuit 112 can be effectively protected. However, the impedance of the capacitive component is rather large at this time, which may attenuate normal signal transmitting and receiving of the protected circuit 112. In the aspects of the present disclosure, the inductive component 114 is additionally provided as a secondary protection circuit, so that a part of the electrostatic energy can also be discharged on the inductive component 114, and thereby the capacitance value of the capacitive component 113 does not need to be set too small.

In the aspects of the present disclosure, the capacitive component 113 and the inductive component 114 form a filter, which is a high pass filter. The cutoff frequency $F_L$ of the filter may be referred to the following formula (4):

$$F_L = \frac{1}{2\pi\sqrt{LC}}; \qquad (4)$$

According to the above formula (4), it can be obtained that the frequency of the filtered signal corresponding to the filter is negatively correlated with the inductance value of the inductive component 114. That is, the smaller the inductance value of the inductive component, the higher the frequency of the filtered signal; and the larger the inductance value, the lower the frequency of the filtered signal. The frequency of the filtered signal is negatively correlated to the capacitance value of the capacitive component 113. That is, the smaller the capacitance value of the capacitive component 113, the higher the frequency of the filtered signal; and the larger the capacitance value, the lower the frequency of the filtered signal.

Since the frequency of static energy is generally dozens of megahertz, all the high-frequency of electrostatic energy can be filtered out by appropriately setting the capacitance value of the capacitive component 113 and the inductance value of the inductive component 114. It requires to decrease the capacitance value or the inductance value if desiring to filter out a higher electrostatic signal frequency, and increase the capacitance value or the inductance value if desiring to enable some energy having a lower static signal frequency to pass to the signal link in the next stage.

In summary, in the electronic device provided by the aspects of the present disclosure, a capacitive component and an inductive component are additionally provided on the circuit board. Thus, in a first aspect, the electrostatic energy can be discharged both through the first electrostatic protection circuit and the inductive component. In a second aspect, the direct current in the electrostatic energy can be isolated by the capacitive component and thereby cannot enter the circuit in the next stage. And in a third aspect, the capacitive component) and the inductive component can form a high pass filter that can filter high-frequency components in the electrostatic energy, so that the radio frequency link in the next stage can be effectively protected and thereby prevented from being damaged by the electrostatic energy.

In an optional aspect based on the exemplary aspect of the present disclosure shown in FIG. 1, the electronic device 100 further includes a metal middle frame, and at least one second electrostatic protection circuit is provided between a main ground point of the circuit board and the metal middle frame. The electronic components included in the second electrostatic protection circuit are the same as those included in the first electrostatic protection circuit, and thereby are not described herein again. In addition, the number of the second electrostatic protection circuit is not limited in the aspects of the present disclosure, which may be set according to actual needs. Exemplarily, the number of the second electrostatic protection circuit is four.

The main ground point of the circuit board, the second electrostatic protection circuit, and the metal middle frame form a path, which is a path satisfying a preset condition among respective discharge paths corresponding to the electrostatic energy. The above preset condition refers to a condition that the path has the shortest length and the lowest impedance.

When the electrostatic energy is discharged to the main ground point of the circuit board, the second electrostatic protection circuit is turned on, and the electrostatic energy is returned to the metal middle frame through the second electrostatic protection circuit, thereby preventing the electrostatic energy from entering the internal functional circuit and causing damages. When the user holds the electronic device, the human body is grounded, so that the static electricity can be introduced into the ground through the human body, which provides a flatter and smoother energy discharging pool for the electrostatic energy.

Figure 4:
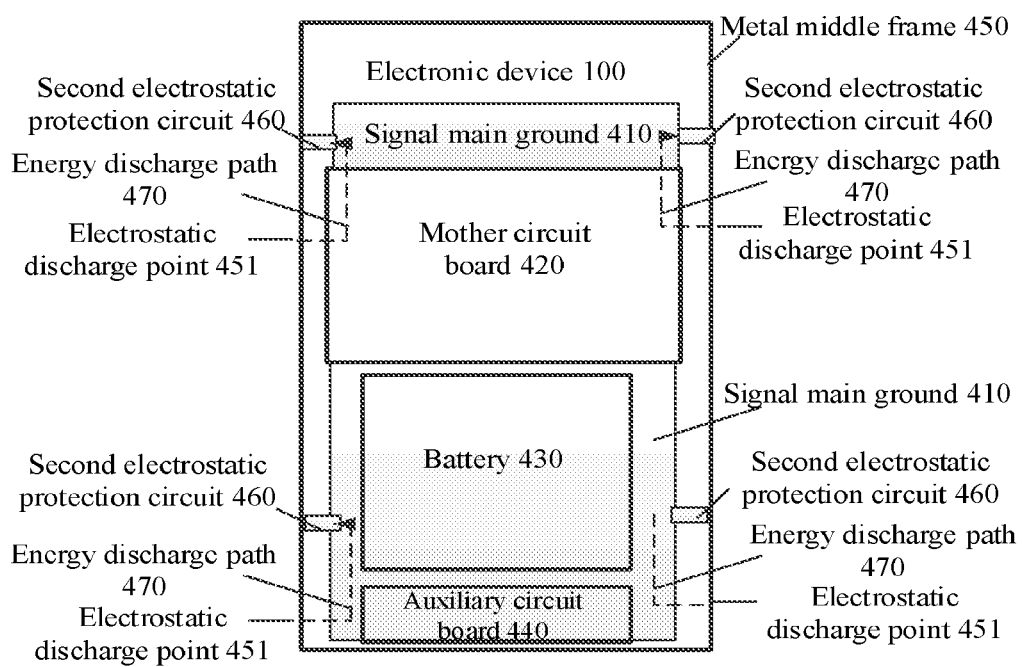
FIG. 4 is a block diagram of an electronic device according to another exemplary aspect of the present disclosure.

In conjunction with and referring to FIG. 4, the electronic device 100 includes a signal main ground 410, a mother circuit board 420, a battery 430, an auxiliary circuit board 440, and a metal middle frame 450. There are four second electrostatic protection circuits 460 between the signal main ground 410 and the metal middle frame 450 of the electronic device 100. When the electrostatic energy is discharged to the signal main ground 410, the second electrostatic protection circuit 460 is turned on. At this time, the electrostatic energy is returned to the electrostatic discharge point 451 on the metal middle frame 450 through the energy discharge path 470, and finally discharged to the ground through the human body.

In summary, in the electronic device provided by the aspects of the present disclosure, an electrostatic protection circuit is provided between the main ground point and the metal middle frame of the electronic device. When the electrostatic energy is discharged to the main ground, the electrostatic protection circuit is turned on in time to provide the electrostatic energy a return path having the shortest length and the lowest impedance, so that the electrostatic energy discharged to the main ground of the signal can be returned to the metal middle frame and flowed out through the human body in time, thereby preventing the electrostatic energy from flowing into the internal functional circuit and causing damages to the functional circuit.

In the related art, a capacitor for adjusting a corresponding radio frequency signal is provided on a hardware auxiliary board, and the capacitor is located in an antenna link. When the signal main ground of the hardware auxiliary board and the ground of a hardware motherboard are in poor contact, the ground impedance of the hardware auxiliary board is large, and the electrostatic energy can be discharged through the path having the lowest impedance. Since the above capacitor for adjusting the corresponding radio frequency signal has a low impedance to the alternating current in the electrostatic energy, the alternating current in the electrostatic energy may be coupled to the antenna link through the above capacitor, and further flowed into the radio frequency link. In addition, the electrostatic energy may be transmitted to the link in the next stage through the antenna link, then enter into a main antenna switch and damage the internal structure, thereby causing damages to a channel of a certain frequency band inside the main antenna switch and great loss in the signal power of the frequency band.

Figure 5:
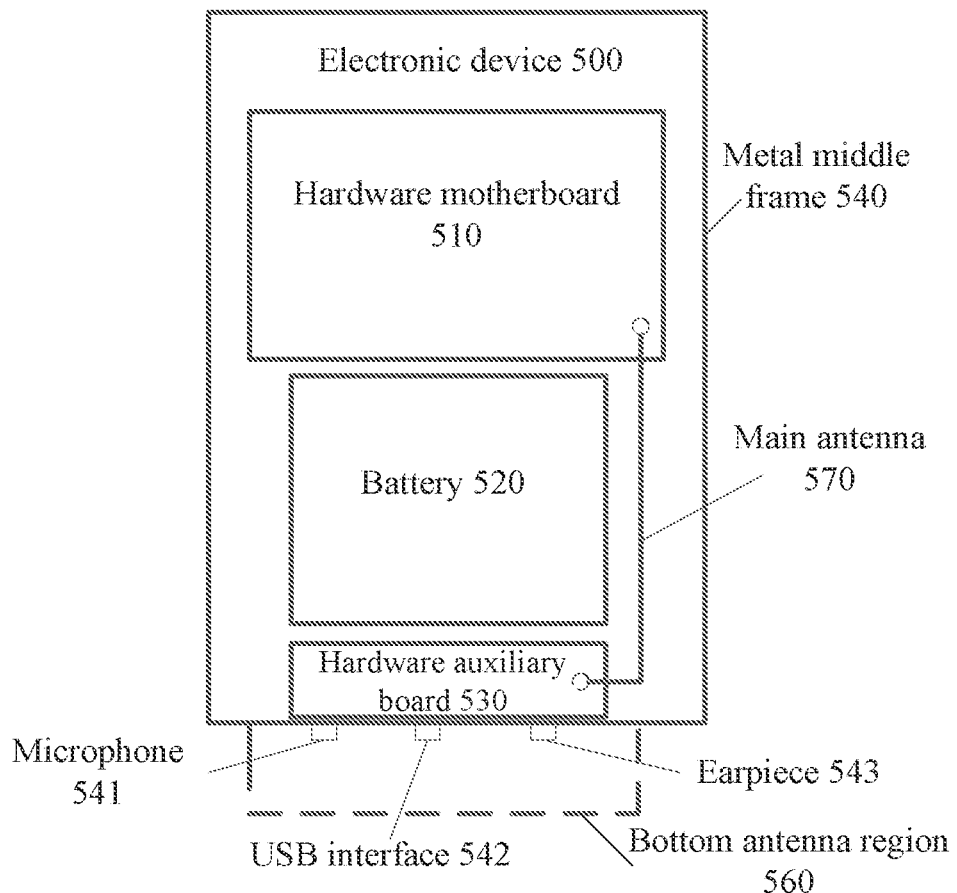
FIG. 5 is a block diagram of an electronic device illustrate the related art.

In conjunction with and referring to FIG. 5, which is a schematic diagram of an electronic device provided by the related art, the electronic device 500 includes a hardware motherboard 510, a battery 520, a hardware auxiliary board 530, and a metal middle frame 540. A portion of the metal middle frame 540 close to the hardware auxiliary board 530 is formed with a microphone 541, a USB interface 542, and an earpiece 543. A portion of the metal middle frame 540 close to the hardware auxiliary board 530 forms a bottom antenna region 560. Furthermore, a main antenna 570 is provided between the hardware auxiliary board 530 and the hardware motherboard 510.

When the signal main ground of the hardware auxiliary board 530 is in poor contact with the ground of the hardware motherboard 510, the electrostatic energy entering from the bottom antenna region 560 may enter into the radio frequency link and the main antenna switch on the hardware motherboard 510 through the main antenna 570, and also cause damages to the radio frequency link and the main antenna switch.

In an optional aspect based on the exemplary aspect of the present disclosure shown in FIG. 1, the circuit board includes a hardware auxiliary board, the auxiliary board has no capacitor for adjusting the corresponding radio frequency link, so that the electrostatic energy cannot be coupled through the capacitor, thereby preventing damages to the radio frequency link and the main antenna switch.

Figure 6:
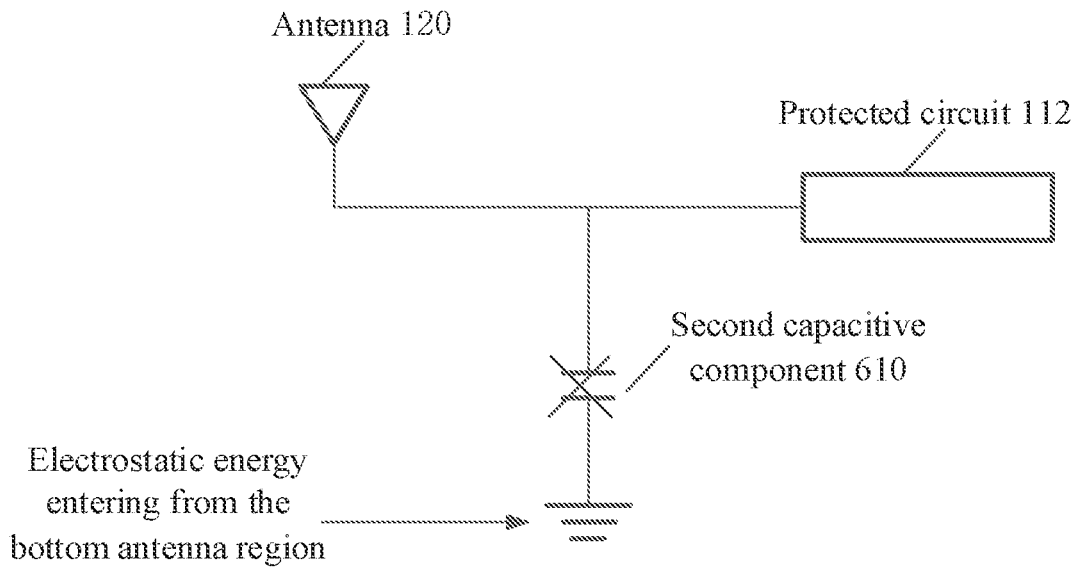
FIG. 6 is a block diagram of an electronic device according to another exemplary aspect of the present disclosure.

In conjunction with and referring to FIG. 6, which shows a circuit diagram in accordance with an aspect of the present disclosure, a capacitor 610 for adjusting the corresponding radio frequency signal is removed from the link between the antenna 120 and the protected circuit 112.

In summary, in the electronic device provided by the aspect of the present disclosure, the capacitor for adjusting the corresponding radio frequency signal is removed from the link between the antenna and the protected circuit, so that the electrostatic energy entering from the bottom antenna region cannot be coupled to the antenna link through the capacitor when the signal main ground of the hardware auxiliary board is in poor contact with the ground of the hardware motherboard, thereby preventing the electrostatic energy from entering the radio frequency link and the main antenna switch on the hardware motherboard to protect the radio frequency link and the main antenna switch.

Figure 7:
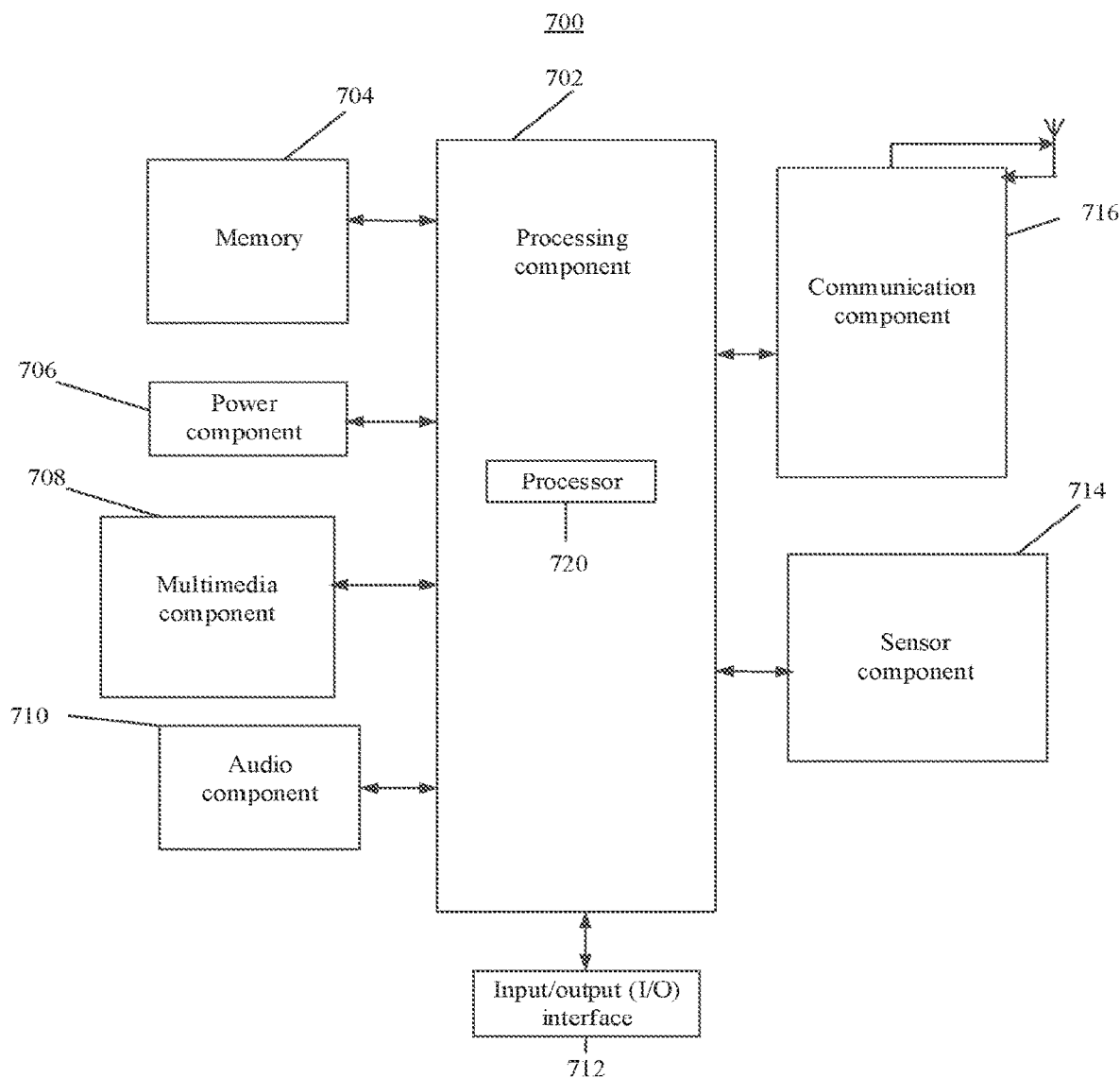
FIG. 7 is a structural block diagram of an electronic device according to an exemplary aspect of the present disclosure.

FIG. 7 is a block diagram of an electronic device 700 in accordance with an exemplary aspect. For example, the electronic device 700 may be a mobile terminal, a tablet computer, a personal computer, and the like Referring to FIG. 7, the electronic device 700 may include one or more of the following components: a processing component 702, a memory 704, a power component 707, a multimedia component 708, an audio component 710, an input/output (I/O) interface 712, a sensor component 714, and a communication component 716.

The processing component 702 typically controls the overall operations of the electronic device 700, such as the operations associated with display, telephone calls, data communications, camera operations, and recording operations. The processing component 702 may include one or more processors 720 to execute instructions to perform all or part of the steps in the above described methods. Moreover, the processing component 702 may include one or more modules which facilitate the interaction between the processing component 702 and other components. For instance, the processing component 702 may include a multimedia module to facilitate the interaction between the multimedia component 708 and the processing component 702.

The memory 704 is configured to store various types of data to support the operation of the electronic device 700. Examples of such data include commands for any applications or methods operated on the electronic device 700, contact data, phonebook data, messages, pictures, videos, etc. The memory 704 may be implemented by using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 707 provides power to various components of the electronic device 700. The power component 707 may include a power management system, one or more power sources, and any other components associated with the generation, management, and power distribution of the electronic device 700.

The multimedia component 708 includes a screen providing an output interface between the electronic device 700 and the user. In some aspects, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense the duration and pressure associated with the touch or swipe action. In some aspects, the multimedia component 808 includes a front camera and/or a rear camera. The front camera and the rear camera may receive external multimedia data while the terminal 800 is in an operation mode, such as a photographing mode or a video mode. Each of the front camera and the rear camera may be a fixed optical lens system or have focus and optical zoom capability.

The audio component 710 is configured to output and/or input audio signals. For example, the audio component 710 includes a microphone (MIC) configured to receive external audio signals when the electronic device 700 is in an operation mode, such as a call mode, a recording mode, and a voice recognition mode. The received audio signal may be further stored in the memory 704 or transmitted via the communication component 717. In some aspects, the audio component 710 further includes a speaker for outputting audio signals.

The I/O interface 712 provides an interface between the processing component 802 and peripheral interface modules, such as a keyboard, a click wheel, buttons, and the like. The buttons may include, but are not limited to, a home button, a volume button, a start button, and a lock button.

The sensor component 714 includes one or more sensors to provide status assessments of various aspects of the electronic device 700. For instance, the sensor component 714 may detect an on/off status of the electronic device 700, relative positioning of components, e.g., the display device and the mini keyboard of the electronic device 700, and the sensor component 714 may also detect a position change of the electronic device 700 or a component of the electronic device 700, presence or absence of user contact with the electronic device 700, orientation or acceleration/deceleration of the electronic device 700, and temperature change of the electronic device 700. The sensor component 714 may include a proximity sensor configured to detect the presence of nearby objects without any physical contact. The sensor component 714 may also include a light sensor, such as a CMOS or CCD image sensor, used for imaging applications. In some aspects, the sensor component 814 may also include an accelerometer sensor, a gyroscope sensor, a magnetic sensor, a pressure sensor, or a temperature sensor.

The communication component 716 is configured to facilitate communication, wired or wirelessly, between the electronic device 700 and other devices. The electronic device 700 can access a wireless network based on a communication standard, such as WiFi, 2G, or 3G, or a combination thereof. In an exemplary aspect, the communication component 717 receives broadcast signals or broadcast associated information from an external broadcast management system via a broadcast channel.

In exemplary aspects, the electronic device 700 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In the aspects of the present disclosure, an electrostatic protection circuit is connected in parallel with a radio frequency circuit, and the trace distance between the electrostatic protection circuit and the radio frequency circuit is set to be short enough to reduce the parasitic inductance generated by the lead. So, when an alternating current signal in the static electricity discharged by the antenna passes through the parasitic inductance, the voltage difference between the second end of the electrostatic protection circuit and the second end of the radio frequency circuit is also small, and the actual turn-on voltage of the electrostatic protection circuit approaches the rated turn-on voltage. That is, when the antenna discharges the static electricity, the electrostatic protection circuit can be turned on in time to protect the radio frequency circuit from being damaged by the electrostatic energy.

It is noted that the various modules, sub-modules, units, and components in the present disclosure can be implemented using any suitable technology. For example, a module may be implemented using circuitry, such as an integrated circuit (IC). As another example, a module may be implemented as a processing circuit executing software instructions.

Other aspects of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and aspects are to be considered as exemplary only, with a true scope and spirit of the present disclosure is indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims,

What is claimed is:

1. An electronic device, comprising:
   a circuit board;
   a housing; and
   an antenna,
   wherein the antenna and the circuit board are fixed inside the housing,
   wherein the circuit board comprises a first electrostatic protection circuit and a protected circuit,
   wherein the antenna is electrically connected to a first end of the first electrostatic protection circuit, and electrically connected to a first end of the protected circuit,
   wherein a second end of the first electrostatic protection circuit is electrically connected to a first ground point, a second end of the protected circuit is electrically connected to a second ground point, and the first electrostatic protection circuit is connected in parallel with the protected circuit, and
   wherein a trace distance between the second end of the first electrostatic protection circuit and the second end of the protected circuit is less than a first threshold, so that a parasitic inductance between the second end of the first electrostatic protection circuit and the second end of the protected circuit approaches zero.

2. The electronic device according to claim 1, wherein a difference value between an actual turn-on voltage and a rated turn-on voltage of the first electrostatic protection circuit is positively correlated with the parasitic inductance.

3. The electronic device according to claim 1, wherein the first electrostatic protection circuit comprises a transient voltage suppressor (TVS).

4. The electronic device according to claim 1, wherein the circuit board further comprises a first capacitive component,
   wherein the antenna and the first end of the first electrostatic protection circuit are electrically connected to a first end of the first capacitive component, and a second end of the first capacitive component is electrically connected to the first end of the protected circuit, and
   wherein the first electrostatic protection circuit is connected in series with the first capacitive component.

5. The electronic device according to claim 4, wherein the circuit board further comprises an inductive component, wherein the antenna, the first end of the first electrostatic protection circuit, and the first end of the first capacitive component are electrically connected to a second end of the inductive component,
   wherein a second end of the inductive component is electrically connected to a third ground point, and
   wherein the inductive component is connected in parallel with the first electrostatic protection circuit and the protected circuit.

6. The electronic device according to claim 5, wherein the inductive component and the first capacitive component form a filter, wherein a frequency of a filtered signal corresponding to the filter is negatively correlated with an inductance value of the inductive component, and is negatively correlated with a capacitance value of the first capacitive component.

7. The electronic device according to claim 1, further comprising:
   a metal middle frame; and
   at least one second electrostatic protection circuit provided between a main ground point of the circuit board and the metal middle frame.

8. The electronic device according to claim 7, wherein the main ground point of the circuit board, the second electrostatic protection circuit, and the metal middle frame form a path that satisfies a preset condition among respective discharge paths corresponding to the electrostatic energy.

9. The electronic device according to claim 8, wherein when the electrostatic energy is discharged to the main ground point of the circuit board, the second electrostatic protection circuit is turned on, and the electrostatic energy is returned to the metal middle frame through the second electrostatic protection circuit.

10. The electronic device according to claim 2, further comprising:
   a metal middle frame; and
   at least one second electrostatic protection circuit provided between a main ground point of the circuit board and the metal middle frame.

11. The electronic device according to claim 10, wherein the main ground point of the circuit board, the second electrostatic protection circuit, and the metal middle frame form a path that satisfies a preset condition among respective discharge paths corresponding to the electrostatic energy.

12. The electronic device according to claim 11, wherein when the electrostatic energy is discharged to the main ground point of the circuit board, the second electrostatic protection circuit is turned on, and the electrostatic energy is returned to the metal middle frame through the second electrostatic protection circuit.

13. The electronic device according to claim 3, further comprising:
   a metal middle frame; and
   at least one second electrostatic protection circuit is provided between a main ground point of the circuit board and the metal middle frame.

14. The electronic device according to claim 13, wherein the main ground point of the circuit board, the second electrostatic protection circuit, and the metal middle frame form a path that satisfies a preset condition among respective discharge paths corresponding to the electrostatic energy.

15. The electronic device according to claim 14, wherein when the electrostatic energy is discharged to the main ground point of the circuit board, the second electrostatic protection circuit is turned on, and the electrostatic energy is returned to the metal middle frame through the second electrostatic protection circuit.

16. The electronic device according to claim 4, further comprising:
   a metal middle frame; and
   at least one second electrostatic protection circuit is provided between a main ground point of the circuit board and the metal middle frame.

17. The electronic device according to claim 16, wherein the main ground point of the circuit board, the second electrostatic protection circuit, and the metal middle frame form a path that satisfies a preset condition among respective discharge paths corresponding to the electrostatic energy.

18. The electronic device according to claim 17, wherein when the electrostatic energy is discharged to the main ground point of the circuit board, the second electrostatic protection circuit is turned on, and the electrostatic energy is returned to the metal middle frame through the second electrostatic protection circuit.

19. The electronic device according to claim 1, wherein the protected circuit is a radio frequency circuit, and the circuit board does not have a second capacitive component for adjusting a corresponding radio frequency signal.

* * * * *